(12) United States Patent
Song et al.

(10) Patent No.: US 11,784,642 B2
(45) Date of Patent: Oct. 10, 2023

(54) TOUCH CIRCUIT, TOUCH PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Erlong Song, Beijing (CN); Fei Yu, Beijing (CN); Huijie Meng, Beijing (CN); Bo Wei, Beijing (CN); Hongjun Zhou, Beijing (CN); Lili Du, Beijing (CN)

(73) Assignees: CHENGDU BOE OPTOELECTRONICS TECHNOLOGY CO., LTD., Sichuan (CN); BOE TECHNOLOGY GROUP CO., LTD., Beling (CN)

( * ) Notice: Subject to any disclaimer, the term of this patent is extended or adjusted under 35 U.S.C. 154(b) by 480 days.

(21) Appl. No.: 17/260,415

(22) PCT Filed: Mar. 31, 2020

(86) PCT No.: PCT/CN2020/082563
§ 371 (c)(1),
(2) Date: Jan. 14, 2021

(87) PCT Pub. No.: WO2021/196010
PCT Pub. Date: Oct. 7, 2021

(65) Prior Publication Data
US 2022/0140827 A1    May 5, 2022

(51) Int. Cl.
*H03K 17/96* (2006.01)
*G06F 3/041* (2006.01)
*G06F 3/044* (2006.01)

(52) U.S. Cl.
CPC .......... *H03K 17/962* (2013.01); *G06F 3/0443* (2019.05); *G06F 3/04164* (2019.05); *H03K 2017/9613* (2013.01)

(58) Field of Classification Search
CPC .......... H03K 17/962; H03K 2017/9613; G06F 3/04164; G06F 3/0443; G06F 3/04182;
(Continued)

(56) References Cited

U.S. PATENT DOCUMENTS

2009/0051644 A1* 2/2009 Shih ............... G02F 1/13338
345/173
2017/0031507 A1* 2/2017 Huang ............... G02F 1/1368
(Continued)

FOREIGN PATENT DOCUMENTS

CN    107479283 A    12/2017
CN    108847176 A    11/2018
(Continued)

*Primary Examiner* — Alvaro E Fortich
(74) *Attorney, Agent, or Firm* — DINSMORE & SHOHL LLP (57) ABSTRACT

The present disclosure provides a touch circuit, a touch panel and a display device. The touch circuit includes: a plurality of touch signal lines electrically connected with a control circuit, a voltage signal line for providing a preset voltage, and a plurality of switching circuits in one to one correspondence with the touch signal lines, wherein each switching circuit of the plurality of the switching circuits is electrically connected with the corresponding touch signal line and the voltage signal line, the switching circuit is configured to be in an off state under a condition that a voltage value on the corresponding touch signal line is within a preset range, and is also configured to be in an on state under a condition that the voltage value on the corresponding touch signal line is not within the preset range.

20 Claims, 5 Drawing Sheets

(58) Field of Classification Search
CPC . G06F 3/0412; H01L 23/552; G02F 1/13338; H10K 59/00
See application file for complete search history.

(56) References Cited

U.S. PATENT DOCUMENTS

| | | | |
|---|---|---|---|
| 2017/0177158 A1* | 6/2017 | Tu | G06F 3/0446 |
| 2019/0018540 A1 | 1/2019 | Ko et al. | |
| 2019/0095032 A1 | 3/2019 | Park et al. | |
| 2019/0235294 A1* | 8/2019 | Wang | G06F 3/0443 |
| 2019/0294310 A1* | 9/2019 | Lee | G06F 3/04184 |

FOREIGN PATENT DOCUMENTS

| | | | |
|---|---|---|---|
| CN | 108877523 A | 11/2018 | |
| CN | 109240528 A | 1/2019 | |
| CN | 109558030 A | 4/2019 | |
| JP | 2011070340 A | 4/2011 | |

* cited by examiner

TOUCH CIRCUIT, TOUCH PANEL AND DISPLAY DEVICE

CROSS-REFERENCE TO RELATED APPLICATIONS

The present application is a U.S. National Stage Application under 35 U.S.C. § 371 of International Patent Application No. PCT/CN2020/082563, filed on Mar. 31, 2020, the disclosure of both of which are hereby incorporated into this disclosure by reference in its entirety.

TECHNICAL FIELD

The present disclosure relates to the field of display technologies, and in particular, to a touch circuit, a touch panel, and a display device.

BACKGROUND

Currently, an AMOLED (Active Matrix Organic Light-Emitting Diode) TSP (Touch Screen Panel) can be classified into an add-on type, an on-cell type and an in-cell type. In the in-cell touch panel, TDDI (Touch and Display Driver Integration) is implemented by introducing a TSP signal line into the panel to obtain a thinner panel and a narrower lower bezel.

SUMMARY

According to a first aspect of the embodiments of the present disclosure, there is provided a touch circuit, comprising: a plurality of touch signal lines electrically connected with a control circuit; a voltage signal line for providing a preset voltage; and a plurality of switching circuits in one to one correspondence with the touch signal lines, wherein each switching circuit of the plurality of the switching circuits is electrically connected with the corresponding touch signal line and the voltage signal line, the switching circuit is configured to be in an off state under a condition that a voltage value on the corresponding touch signal line is within a preset range, and is also configured to be in an on state under a condition that the voltage value on the corresponding touch signal line is not within the preset range.

In some embodiments, the voltage signal line comprises a first voltage sub-signal line; the switching circuit comprises a first switching sub-circuit electrically connected with the corresponding touch signal line and the first voltage sub-signal line respectively, wherein the first switching sub-circuit is in an off state under a condition that the voltage value of the corresponding touch signal line is not greater than a first preset voltage value, and the first switching sub-circuit is in an on state under a condition that the voltage value of the corresponding touch signal line is greater than the first preset voltage value.

In some embodiments, the first switching sub-circuit comprises a first transistor, wherein a first electrode of the first transistor is electrically connected to the corresponding touch signal line, and a second electrode of the first transistor is electrically connected to the first voltage sub-signal line, and a gate of the first transistor is electrically connected to the second electrode of the first transistor.

In some embodiments, the first electrode and the second electrode of the first transistor are in an off state under a condition that the voltage value on the corresponding touch signal line is not greater than the first preset voltage value; and the first electrode and the second electrode of the first transistor are in an on state under a condition that the voltage value on the corresponding touch signal line is greater than the first preset voltage value.

In some embodiments, the voltage signal line further comprises a second voltage sub-signal line, wherein a voltage value on the first voltage sub-signal line is greater than a voltage value on the second voltage sub-signal line; and the switching circuit further comprises a second switching sub-circuit electrically connected with the corresponding touch signal line and the second voltage sub-signal line respectively, wherein the second switching sub-circuit is in an on state under a condition that the voltage value of the corresponding touch signal line is not greater than a second preset voltage value, and the second switching sub-circuit is in an off state under a condition that the voltage value of the corresponding touch signal line is greater than the second preset voltage value.

In some embodiments, the second switching sub-circuit comprises a second transistor, wherein a first electrode of the second transistor is electrically connected to the second voltage sub-signal line, a second electrode of the second transistor is electrically connected to the corresponding touch signal line, and a gate of the second transistor is electrically connected to the second electrode of the second transistor.

In some embodiments, the first electrode and the second electrode of the second transistor are in an on state under a condition that the voltage value of the corresponding touch signal line is not greater than the second preset voltage value; and the first electrode and a second electrode of the second transistor are in an off state under a condition that the voltage value of the corresponding touch signal line is greater than the second preset voltage value.

In some embodiments, the touch circuit further comprising: a plurality of filter circuits in one to one correspondence with the touch signal lines, wherein a first end of each filter circuit of the plurality of the filter circuits is electrically connected with the corresponding touch signal line, and a second end of the filter circuit is electrically connected with the control circuit.

In some embodiments, the filter circuit comprises an RC filter circuit.

In some embodiments, the touch circuit further comprising: a closed line disposed on a same layer as the touch signal lines and a common voltage signal line, wherein the closed line isolates the touch signal lines from the common voltage signal line.

In some embodiments, the closed line is electrically connected with the control circuit.

In some embodiments, the closed line is grounded under the control of the control circuit.

According to a second aspect of the embodiments of the present disclosure, a touch panel is provided, which comprising a touch circuit, the touch circuit comprising: a plurality of touch signal lines electrically connected with a control circuit; a voltage signal line for providing a preset voltage; and a plurality of switching circuits in one to one correspondence with the touch signal lines, wherein each switching circuit of the plurality of the switching circuits is electrically connected with the corresponding touch signal line and the voltage signal line, the switching circuit is configured to be in an off state under a condition that a voltage value on the corresponding touch signal line is within a preset range, and is also configured to be in an on state under a condition that the voltage value on the corresponding touch signal line is not within the preset range.

In some embodiments, the voltage signal line comprises a first voltage sub-signal line; and the switching circuit comprises a first switching sub-circuit electrically connected with the corresponding touch signal line and the first voltage sub-signal line respectively, wherein the first switching sub-circuit is in an off state under a condition that the voltage value of the corresponding touch signal line is not greater than a first preset voltage value, and the first switching sub-circuit is in an on state under a condition that the voltage value of the corresponding touch signal line is greater than the first preset voltage value.

In some embodiments, the voltage signal line further comprises a second voltage sub-signal line, wherein a voltage value on the first voltage sub-signal line is greater than a voltage value on the second voltage sub-signal line; and the switching circuit further comprises a second switching sub-circuit electrically connected with the corresponding touch signal line and the second voltage sub-signal line respectively, wherein the second switching sub-circuit is in an on state under a condition that the voltage value of the corresponding touch signal line is not greater than a second preset voltage value, and the second switching sub-circuit is in an off state under a condition that the voltage value of the corresponding touch signal line is greater than the second preset voltage value.

In some embodiments, the touch circuit further comprising: a plurality of filter circuits in one to one correspondence with the touch signal lines, wherein a first end of each filter circuit of the plurality of the filter circuits is electrically connected with the corresponding touch signal line, and a second end of the filter circuit is electrically connected with the control circuit.

In some embodiments, the touch circuit further comprising: a closed line disposed on a same layer as the touch signal lines and the voltage signal line, wherein the closed line isolates the touch signal lines from the voltage signal line.

In some embodiments, the closed line is electrically connected with the control circuit.

In some embodiments, the touch panel comprising a display area comprising a pixel driving circuit; and a peripheral area, in which the switching circuits and the control circuit in the touch circuit are disposed, wherein a closed line disposed in the touch circuit is disposed around the peripheral area in a closed mode and the switching circuits and the pixel driving circuit are disposed on the same layer.

According to a third aspect of the embodiments of the present disclosure, there is provided a display device comprising the touch panel according to any one of the embodiments mentioned above.

Other features of the present disclosure and advantages thereof will become apparent from the following detailed description of exemplary embodiments thereof, which proceeds with reference to the accompanying drawings.

BRIEF DESCRIPTION OF THE DRAWINGS

The accompanying drawings, which are incorporated in and constitute a part of this specification, illustrate embodiments of the disclosure and together with the description, serve to explain the principles of the disclosure.

The present disclosure may be more clearly understood from the following detailed description taken in conjunction with the accompanying drawings, in which.

It should be understood that the dimensions of the various parts shown in the drawings are not drawn according to the actual proportional relationship. Further, the same or similar reference numerals denote the same or similar components.

DETAILED DESCRIPTION

Various exemplary embodiments of the present disclosure will now be described in detail with reference to the accompanying drawings. The description of the exemplary embodiments is merely illustrative and is in no way intended to limit the disclosure, its application, or uses. The present disclosure may be embodied in many different forms and is not limited to the embodiments described herein. These embodiments are provided so that this disclosure will be thorough and complete, and will fully convey the scope of the disclosure to those skilled in the art. It should be noted that: the relative arrangement of parts and steps, the composition of materials and values set forth in these embodiments are to be construed as illustrative only and not as limiting unless otherwise specifically stated.

The use of "first", "second", and similar words in this disclosure is not intended to indicate any order, quantity, or importance, but rather is used to distinguish one element from another. The word "comprising" or "including", and the like, means that the element preceding the word comprises the element listed after the word, and does not exclude the possibility that other elements may also be included.

All terms (including technical or scientific terms) used herein have the same meaning as commonly understood by one of ordinary skill in the art to which this disclosure belongs unless specifically defined otherwise. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Techniques, methods, and apparatus known to one of ordinary skill in the relevant art may not be discussed in detail but are intended to be part of the specification where appropriate.

The inventors found through study that, in the in-cell touch panel, TSP signal lines is disposed in the panel, the touch signals transmitted in the TSP signal lines are interfered by external electrostatic interference, thereby causing the performance of the touch panel to be degraded.

Accordingly, the present disclosure provides a touch circuit, so as to effectively reduce electrostatic interference on a touch signal.

Figure 1:
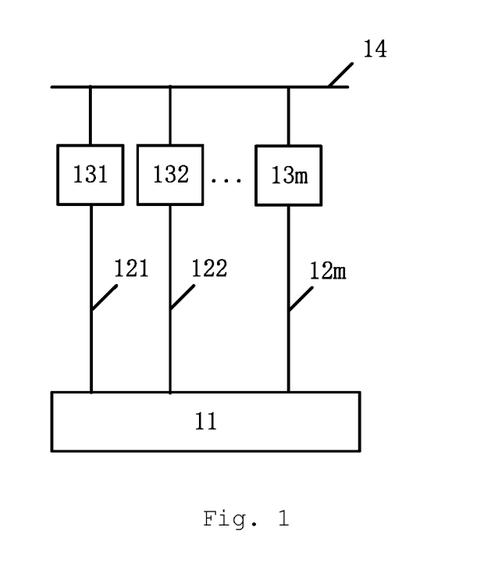
FIG. 1 is a schematic structural diagram of a touch circuit according to one embodiment of the present disclosure.

FIG. 1 is a schematic structural diagram of a touch circuit according to one embodiment of the present disclosure. As shown in FIG. 1, the touch circuit comprises a control circuit 11, a plurality of touch signal lines 121-12m electrically connected to the control circuit 11, a plurality of switching circuits 131-13m, and a voltage signal line 14. The voltage signal line 14 is used for providing a preset voltage. The switching circuits 131-13m are in one to one correspondence with the touch signal lines 121-12m.

In some embodiments, the control circuit 11 comprises a touch IC (Integrated Circuit). The switching circuits 131-13m comprise circuits having a switching function.

Each switching circuit is electrically connected with the corresponding touch signal line and the corresponding voltage signal line respectively. The each switching circuit is configured to be in an off state under a condition that a voltage value on the corresponding touch signal line is within a preset range, and is further configured to be in an on state under a condition that the voltage value on the corresponding touch signal line is not within the preset range.

For example, a switching circuit 131 is electrically connected to the corresponding touch signal line 121 and voltage signal lines 14, respectively, and a switching circuit 132 is electrically connected to the corresponding touch signal line 122 and voltage signal lines 14, respectively. If the touch signal on the touch signal line 121 is interfered by external electrostatic interference, so that a voltage value of the touch signal is not within the preset range, the switching circuit 131 is in an on state under this condition, therefore the touch signal line 121 and the voltage signal line 14 are electrically connected. If the voltage value of the touch signal on the touch signal line 122 is within the preset range, the switching circuit 132 is in an off state, so that the touch signal line 121 and the voltage signal line 14 are not electrically connected.

In the touch circuit provided by the above embodiment of the present disclosure, under a condition that the voltage value of the touch signal on the touch signal line is abnormal due to external electrostatic interference, the switching circuit uses the voltage value provided by the voltage signal line as the voltage value of the touch signal, thereby avoiding the performance of the touch circuit from being affected by the abnormal voltage of the touch signal.

Figure 2:
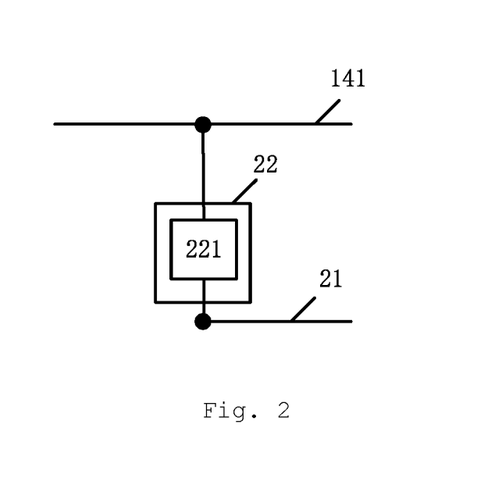
FIG. 2 is a schematic structural diagram of a switching circuit according to one embodiment of the present disclosure.

FIG. 2 is a schematic structural diagram of a switching circuit according to one embodiment of the present disclosure. As shown in FIG. 2, the switching circuit 22 comprises a first switching sub-circuit 221. Further, the voltage signal line 14 comprises a first voltage sub-signal line 141. The first switching sub-circuit 221 is electrically connected to the corresponding touch signal line 21 and the first voltage sub-signal line 141, respectively.

In some embodiments, the first switching sub-circuit 221 comprises a circuit having a switching function. The first voltage sub-signal line 141 is a high-potential signal VGH signal line.

The first switching sub-circuit 221 is in an off state under a condition that a voltage value of a touch signal on the corresponding touch signal line 21 is not greater than the first preset voltage value. The first switching sub-circuit 221 is in an on state under a condition that the voltage value of the touch signal on the corresponding touch signal line 21 is greater than the first preset voltage value.

For example, the first preset voltage is a positive voltage. If the touch signal on the touch signal line 21 is interfered by external electrostatic interference, the voltage value of the touch signal is greater than the first preset voltage value. In this case, the first switching sub-circuit 221 is in an on state, so that the voltage value provided by the first voltage sub-signal line 141 is used as the voltage value of the touch signal. Therefore, the voltage value of the touch signal on the touch signal line 21 is not greater than the first preset voltage value, and the influence on the performance of the touch circuit due to the abnormal voltage of the touch signal is avoided.

On the contrary, if the voltage value of the touch signal on the touch signal line 21 is not greater than the first preset voltage value, it indicates that the voltage value of the touch signal is within the normal range. In this case, the first switching sub-circuit 221 is in an off state, so that the touch signal on the touch signal line 21 is not affected by the first voltage sub-signal line 141.

Figure 3:
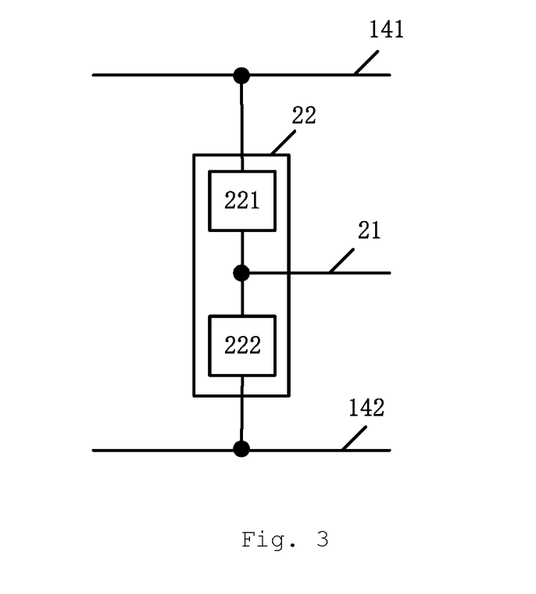
FIG. 3 is a schematic structural diagram of a switching circuit according to another embodiment of the present disclosure.

FIG. 3 is a schematic structural diagram of a switching circuit according to another embodiment of the present disclosure. FIG. 3 differs from FIG. 2 in that, in the embodiment shown in FIG. 3, the switching circuit 22 further comprises a second switching sub-circuit 222. Further, the voltage signal line 14 comprises a second voltage sub-signal line 142. The second switching sub-circuit 222 is electrically connected to the corresponding touch signal line 21 and the second voltage sub-signal line 142.

It should be noted that a voltage value of the first voltage sub-signal line 141 is greater than a voltage value of the second voltage sub-signal line 142. For example, the voltage value on the first voltage sub-signal line 141 is a positive voltage, and the voltage value on the second voltage sub-signal line 142 is a negative voltage.

In some embodiments, the second switching sub-circuit 222 comprises a circuit having a switching function. The second voltage sub-signal line 142 is a low potential signal VGL signal line.

The second switching sub-circuit 222 is in an on state under a condition that the voltage value on the corresponding touch signal line 21 is not greater than the second preset voltage value. The second switching sub-circuit 222 is in an off state under a condition that the voltage value of the corresponding touch signal line 21 is greater than the second preset voltage value. The second preset voltage value is smaller than the first preset voltage value. In some embodiments, the first preset voltage is a positive voltage and the second preset voltage is a negative voltage.

For example, if the touch signal line 21 is interfered by external electrostatic interference, a small voltage fluctuation will be generated on the touch signal line 21 even if the touch signal line 21 does not transmit the touch signal. In this case, the second switching sub-circuit 222 is in an on state under a condition that the voltage value on the touch signal line 21 is not greater than the second preset voltage value, so as to use the voltage provided by the second voltage sub-signal line 142 as the voltage value of the touch signal. Therefore, the voltage value of the touch signal on the touch signal line 21 is not less than the second preset voltage value, and the influence on the performance of the touch circuit caused by the voltage fluctuation on the touch signal line 21 is avoided.

On the contrary, if the voltage value of the touch signal on the touch signal line 21 is greater than the second preset voltage value, it indicates that the touch signal is transmitted on the current touch signal line 21. In this case, the second switching sub-circuit 222 is in an off state. Therefore the second voltage sub-signal line 142 does not affect the touch signal on the touch signal line 21.

Figure 4:
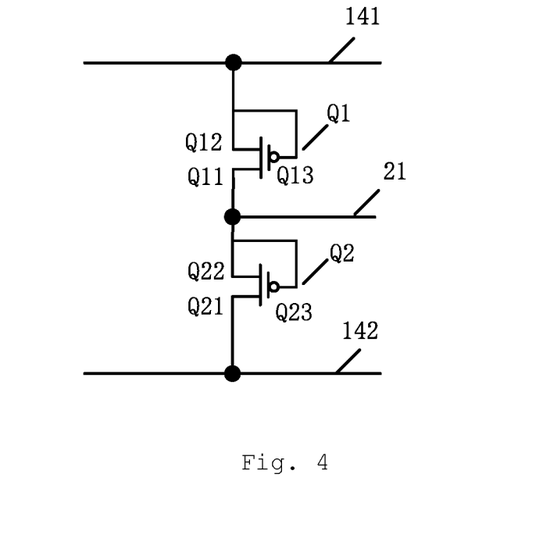
FIG. 4 is a schematic structural diagram of a switching circuit according to still another embodiment of the present disclosure.

FIG. 4 is a schematic structural diagram of a switching circuit according to still another embodiment of the present disclosure. FIG. 4 differs from FIG. 3 in that, in the embodiment shown in FIG. 4, the first switching sub-circuit 221 comprises a first transistor Q1, and the second switching sub-circuit 222 comprises a second transistor Q2.

A first electrode Q11 of the first transistor Q1 is electrically connected with the corresponding touch signal line 21, a second electrode Q12 of the first transistor Q1 is electrically connected with the first voltage sub-signal line 141, and a gate Q13 of the first transistor Q1 is electrically connected with the second electrode Q12 of the first transistor Q1. A first electrode Q21 of the second transistor Q2 is electrically connected with the second voltage sub-signal line 142, a second electrode Q22 of the second transistor Q2 is electrically connected with the corresponding touch signal line 21, and a gate Q23 of the second transistor Q2 is electrically connected with the second electrode Q22 of the second transistor Q2.

The first electrode Q11 and the second electrode Q12 of the first transistor Q1 are in an off state under a condition that a voltage value on the corresponding touch signal line 21 is not greater than the first preset voltage value. The first electrode Q11 and the second electrode Q12 of the first transistor Q1 are in an on state under a condition that the voltage value on the corresponding touch signal line 21 is greater than the first preset voltage value.

The first electrode Q21 and the second electrode Q22 of the second transistor Q2 are in an on state under a condition that the voltage value on the corresponding touch signal line 21 is not greater than the second preset voltage value. The first electrode Q21 and the second electrode Q22 of the second transistor Q2 are in an off state under a condition that the voltage value on the corresponding touch signal line 21 is greater than the second preset voltage value.

By using the first switching sub-circuit 221 and the second switching sub-circuit 222, the voltage of the touch signal provided to the control circuit 11 can be ensured within a preset range, thereby effectively avoiding the influence of external electrostatic interference on the performance of the touch circuit.

Figure 5:
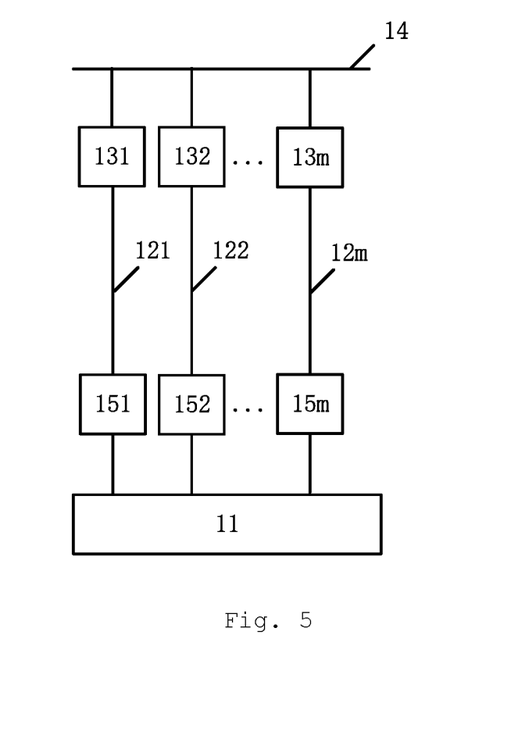
FIG. 5 is a schematic structural diagram of a touch circuit according to another embodiment of the present disclosure.

FIG. 5 is a schematic structural diagram of a touch circuit according to another embodiment of the disclosure. FIG. 5 is different from FIG. 1 in that, in the embodiment shown in FIG. 5, the touch circuit further comprises a plurality of filter circuits 151-15m. The filter circuits 151-15m are in one to one correspondence with the touch signal lines 121-12m. Each filter circuit has a first end and a second end. The first end is electrically connected to the corresponding touch signal line, and the second end is electrically connected to the control circuit 11. For example, the filter circuit 151 can perform noise filtering on the touch signal line 121, and the filter circuit 152 can perform noise filtering on the touch signal line 122. The performance of the touch circuit can be improved by filtering the noise of the touch signal.

In some embodiments, the each filter circuit comprises an RC filter circuit or other suitable filter circuit.

Figure 6:
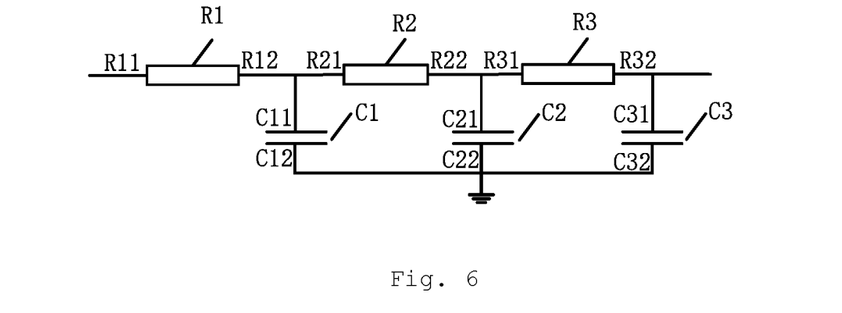
FIG. 6 is a schematic structural diagram of an RC filter circuit according to one embodiment of the present disclosure.

FIG. 6 is a schematic structural diagram of an RC filter circuit according to one embodiment of the disclosure.

As shown in FIG. 6, the RC filter circuit comprises resistors R1, R2 and R3, and capacitors C1, C2 and C3. A first end R1*l* of the resistor R1 is electrically connected to the touch signal line, and a second end R12 of the resistor R1 is electrically connected to a first end R21 of the resistor R2 and a first end C11 of the capacitor C1. A second end R22 of the resistor R2 is electrically connected with a first end R31 of the resistor R3 and a first end C21 of the capacitor C2. A second end R32 of the resistor R3 is electrically connected to the control circuit and a first end C31 of the capacitor C3. A second end C12 of the capacitor C1, a second end C22 of the capacitor C2 and a second end C32 of the capacitor C3 are grounded. That is, the second end C12 of the capacitor C1, the second end C22 of the capacitor C2, and the second end C32 of the capacitor C3 are electrically connected to the ground end of the touch circuit, respectively.

By using the filter circuit, noise in the touch signal on the corresponding touch signal line can be filtered, so that the performance of the touch circuit is improved.

It should be noted that, as an example, the RC filter circuit shown in FIG. 6 comprises 3 capacitors. Of course, the number of capacitors is not limited to this, and the number of capacitors comprises in the RC filter circuit may be more than 3, or less than 3.

In some embodiments, LTPS (Low Temperature polysilicon) trace is used as resistor. The LTPS trace has larger resistance, which is beneficial to releasing interference signals.

In some embodiments, a Gate electrode (Gate) layer trace and a Source Drain (SD) layer trace are used as two plates of a capacitor in the RC filter circuit.

Figure 7:
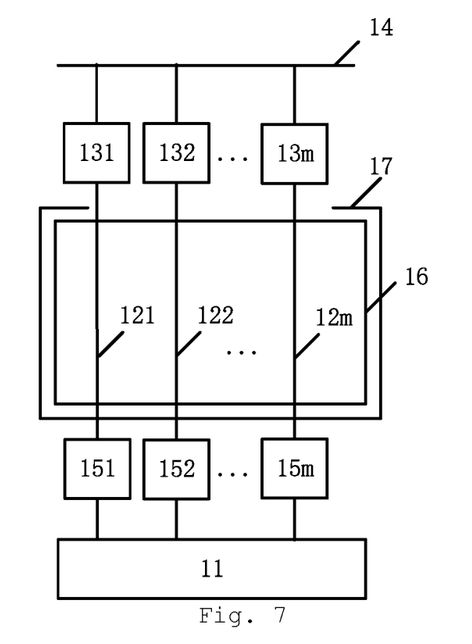
FIG. 7 is a schematic structural diagram of a touch circuit according to still another embodiment of the present disclosure.

FIG. 7 is a schematic structural diagram of a touch circuit according to still another embodiment of the present disclosure.

FIG. 7 is different from FIG. 5 in that, in the embodiment shown in FIG. 7, the touch circuit further comprises a closed line 16 and a common voltage signal line 17. The closed line 16, the touch signal lines 121-12m and the common voltage signal line 17 are disposed in a same layer. That is, the closed line 16, the touch signal lines 121-12m and the common voltage signal line 17 are disposed in the same film layer in the touch circuit. For example, each touch signal line is formed by a metal line in the same film layer. The closed line 16 isolates the plurality of touch signal lines 121-12m from the common voltage signal line 17. That is, on a same plane where the closed line 16, the plurality of touch signal lines 121-12m, and the common voltage signal line 17 are disposed, the closed line 16 divides the plane into two areas, that is, a first area surrounded by the closed line 16, and a second area on the plane except the first area, and the closed line 16 is a boundary between the first area and the second area. The touch signal lines 121-12m are disposed in the first area. The switching circuit and the filter circuit configured for each touch signal line are disposed in the second area.

It should be noted that the closed line 16 corresponds to a coil. According to the principle of electromagnetic induction, a changing voltage signal on the common voltage signal line 17 generates a changing magnetic field, and the generated magnetic field generates induced charges in the coil, and the induced charges can shield the generated magnetic field. The closed line 16, the touch signal lines 121-12m and the common voltage signal line 17 are disposed on the same plane, so that the influence of the magnetic field generated by the common voltage signal line 17 disposed on the same layer on the touch signal lines 121-12m disposed in the closed line 16 can be effectively reduced.

In some embodiments, the common voltage signal line 17 comprises a low voltage power supply signal VSS line.

Figure 8:
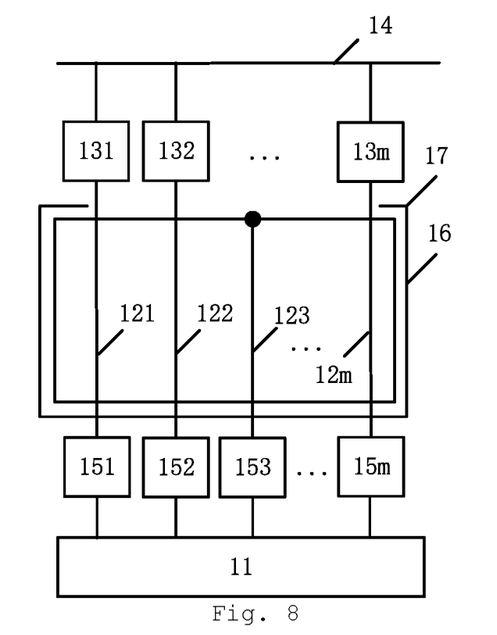
FIG. 8 is a schematic structural diagram of a touch circuit according to still another embodiment of the present disclosure.

FIG. 8 is a schematic structural diagram of a touch circuit according to still another embodiment of the disclosure. FIG. 8 is different from FIG. 7 in that, in the embodiment shown in FIG. 8, the closed line 16 and the control circuit 11 are electrically connected through at least one spare touch circuit.

For example, one end of a spare touch line 123 is electrically connected to the closed line 16, and the other end of the spare touch line 123 is electrically connected to the control circuit 11 through the corresponding filter circuit 153. The voltage value of the closed line 16 can thus be controlled by means of the control circuit 11.

It should be noted that the spare touch line 123 is a touch line that does not transmit touch signals.

In some embodiments, the control circuit 11 controls the closed line 16 to be grounded through the touch line 123. Since the closed line 16 is grounded, it is possible to better electromagnetically shield the plurality of touch signal lines 121-12m disposed inside the closed line 16.

Figure 9:
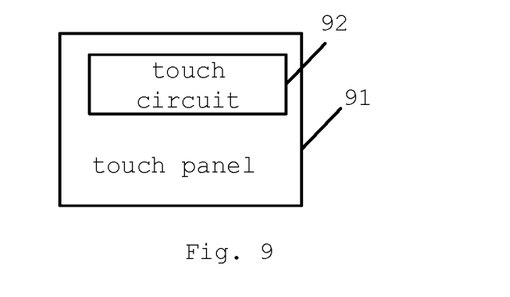
FIG. 9 is a schematic structural diagram of a touch panel according to one embodiment of the present disclosure.

FIG. 9 is a schematic structural diagram of a touch panel according to an embodiment of the present disclosure. As shown in FIG. 9, the touch panel 91 comprises a touch circuit 92. The touch circuit 92 is the touch circuit according to any one of the embodiments of FIGS. 1 to 8.

The present disclosure also provides a display device. The display device comprises the touch panel according to any one of the embodiments of FIG. 9. The display device can be any product or component with a display function, such as a display, a mobile phone, a tablet personal computer, a television, a notebook computer, a digital photo frame, a navigator and the like.

Figure 10:
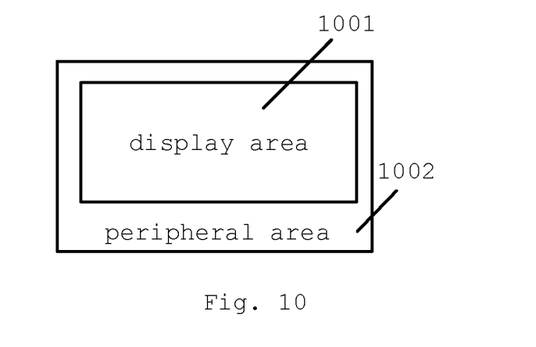
FIG. 10 is a schematic structural diagram of a touch panel according to another embodiment of the present disclosure.

FIG. 10 is a schematic structural diagram of a touch panel according to another embodiment of the disclosure.

As shown in FIG. 10, the touch panel comprises a display area 1001 and a peripheral area 1002. The display area 1001 comprises a pixel driving circuit, and switching circuits and a control circuit in the touch circuit are disposed in the peripheral area 1002. The closed line disposed in the touch circuit is disposed around the peripheral area 1002 in a closed mode, and the switching circuits in the touch circuit and the pixel driving circuit in the display area 1001 are disposed in the same layer.

So far, embodiments of the present disclosure have been described in detail. Some details well known in the art have not been described in order to avoid obscuring the concepts of the present disclosure. Those skilled in the art can now fully appreciate how to implement the teachings disclosed herein, in view of the foregoing description.

Although some specific embodiments of the present disclosure have been described in detail by way of example, it should be understood by those skilled in the art that the above examples are for illustration only and are not intended to limit the scope of the present disclosure. It will be understood by those skilled in the art that various changes may be made and equivalents may be substituted for elements thereof without departing from the scope and spirit of the present disclosure. The scope of the present disclosure is defined by the appended claims.

What is claimed is:

1. A touch circuit, comprising:
   a plurality of touch signal lines electrically connected with a control circuit;
   a voltage signal line for providing a preset voltage; and
   a plurality of switching circuits in one to one correspondence with the touch signal lines, wherein each switching circuit of the plurality of the switching circuits is electrically connected with the corresponding touch signal line and the voltage signal line, the switching circuit is configured to be in an off state under a condition that a voltage value on the corresponding touch signal line is within a preset range, and is also configured to be in an on state under a condition that the voltage value on the corresponding touch signal line is not within the preset range.

2. The touch circuit according to claim 1, wherein:
   the voltage signal line comprises a first voltage sub-signal line; and
   the switching circuit comprises a first switching sub-circuit electrically connected with the corresponding touch signal line and the first voltage sub-signal line respectively, wherein the first switching sub-circuit is in an off state under a condition that the voltage value of the corresponding touch signal line is not greater than a first preset voltage value, and the first switching sub-circuit is in an on state under a condition that the voltage value of the corresponding touch signal line is greater than the first preset voltage value.

3. The touch circuit according to claim 2, wherein the first switching sub-circuit comprises a first transistor, wherein a first electrode of the first transistor is electrically connected to the corresponding touch signal line, and a second electrode of the first transistor is electrically connected to the first voltage sub-signal line, and a gate of the first transistor is electrically connected to the second electrode of the first transistor.

4. The touch circuit according to claim 3, wherein:
   the first electrode and the second electrode of the first transistor are in an off state under a condition that the voltage value on the corresponding touch signal line is not greater than the first preset voltage value; and
   the first electrode and the second electrode of the first transistor are in an on state under a condition that the voltage value on the corresponding touch signal line is greater than the first preset voltage value.

5. The touch circuit according to claim 2, wherein:
   the voltage signal line further comprises a second voltage sub-signal line, wherein a voltage value on the first voltage sub-signal line is greater than a voltage value on the second voltage sub-signal line; and
   the switching circuit further comprises a second switching sub-circuit electrically connected with the corresponding touch signal line and the second voltage sub-signal line respectively, wherein the second switching sub-circuit is in an on state under a condition that the voltage value of the corresponding touch signal line is not greater than a second preset voltage value, and the second switching sub-circuit is in an off state under a condition that the voltage value of the corresponding touch signal line is greater than the second preset voltage value.

6. The touch circuit according to claim 5, wherein the second switching sub-circuit comprises a second transistor, wherein a first electrode of the second transistor is electrically connected to the second voltage sub-signal line, a second electrode of the second transistor is electrically connected to the corresponding touch signal line, and a gate of the second transistor is electrically connected to the second electrode of the second transistor.

7. The touch circuit according to claim 6, wherein:
the first electrode and the second electrode of the second transistor are in an on state under a condition that the voltage value of the corresponding touch signal line is not greater than the second preset voltage value; and
the first electrode and a second electrode of the second transistor are in an off state under a condition that the voltage value of the corresponding touch signal line is greater than the second preset voltage value.

8. The touch circuit according to claim 1, further comprising:
a plurality of filter circuits in one to one correspondence with the touch signal lines,
wherein a first end of each filter circuit of the plurality of the filter circuits is electrically connected with the corresponding touch signal line, and a second end of the filter circuit is electrically connected with the control circuit.

9. The touch circuit according to claim 8, wherein the filter circuit comprises an RC filter circuit.

10. The touch circuit according to claim 8, further comprising:
a closed line disposed on a same layer as the touch signal lines and a common voltage signal line, wherein the closed line isolates the touch signal lines from the common voltage signal line.

11. The touch circuit according to claim 10, wherein the closed line is electrically connected with the control circuit.

12. The touch circuit according to claim 11, wherein the closed line is grounded under the control of the control circuit.

13. A touch panel, comprising a touch circuit, the touch circuit comprising:
a plurality of touch signal lines electrically connected with a control circuit;
a voltage signal line for providing a preset voltage, and
a plurality of switching circuits in one to one correspondence with the touch signal lines, wherein each switching circuit of the plurality of the switching circuits is electrically connected with the corresponding touch signal line and the voltage signal line, the switching circuit is configured to be in an off state under a condition that a voltage value on the corresponding touch signal line is within a preset range, and is also configured to be in an on state under a condition that the voltage value on the corresponding touch signal line is not within the preset range.

14. The touch panel according to claim 13, comprising:
a display area comprising a pixel driving circuit; and
a peripheral area, in which the switching circuits and the control circuit in the touch circuit are disposed, wherein
a closed line disposed in the touch circuit is disposed around the peripheral area in a closed mode and the switching circuits and the pixel driving circuit are disposed on the same layer.

15. A display device comprising the touch panel according to claim 13.

16. The touch panel according to claim 13, wherein:
the voltage signal line comprises a first voltage sub-signal line; and
the switching circuit comprises a first switching sub-circuit electrically connected with the corresponding touch signal line and the first voltage sub-signal line respectively, wherein the first switching sub-circuit is in an off state under a condition that the voltage value of the corresponding touch signal line is not greater than a first preset voltage value, and the first switching sub-circuit is in an on state under a condition that the voltage value of the corresponding touch signal line is greater than the first preset voltage value.

17. The touch panel according to claim 16, wherein:
the voltage signal line further comprises a second voltage sub-signal line, wherein a voltage value on the first voltage sub-signal line is greater than a voltage value on the second voltage sub-signal line; and
the switching circuit further comprises a second switching sub-circuit electrically connected with the corresponding touch signal line and the second voltage sub-signal line respectively, wherein the second switching sub-circuit is in an on state under a condition that the voltage value of the corresponding touch signal line is not greater than a second preset voltage value, and the second switching sub-circuit is in an off state under a condition that the voltage value of the corresponding touch signal line is greater than the second preset voltage value.

18. The touch panel according to claim 13, wherein the touch circuit further comprising:
a plurality of filter circuits in one to one correspondence with the touch signal lines,
wherein a first end of each filter circuit of the plurality of the filter circuits is electrically connected with the corresponding touch signal line, and a second end of the filter circuit is electrically connected with the control circuit.

19. The touch panel according to claim 18, wherein the touch circuit further comprising:
a closed line disposed on a same layer as the touch signal lines and the voltage signal line, wherein the closed line isolates the touch signal lines from the voltage signal line.

20. The touch panel according to claim 19, wherein the closed line is electrically connected with the control circuit.

* * * * *